(12) United States Patent
Xie et al.

(10) Patent No.: US 10,976,344 B1
(45) Date of Patent: Apr. 13, 2021

(54) SYSTEM AND METHOD FOR PERFORMING SCANNING TUNNELING MICROSCOPY ON CURRENT-CARRYING SAMPLES

(71) Applicants: UNIVERSITY OF MARYLAND, COLLEGE PARK, College Park, MD (US); Government of the United States as represented by the Director, National Security Agency, Washington, DC (US)

(72) Inventors: Ting Xie, Burtonsville, MD (US); Michael Dreyer, College Park, MD (US); Isaak D. Mayergoyz, Rockville, MD (US); Robert E. Butera, Prince Frederick, MD (US); Charles S. Krafft, Owings, MD (US)

(73) Assignees: University of Maryland, College Park, College Park, MD (US); Government of the United States of America as Represented by the Director, National Security Agency, Fort Meade, MD (US)

( * ) Notice: Subject to any disclaimer, the term of this patent is extended or adjusted under 35 U.S.C. 154(b) by 0 days.

(21) Appl. No.: 16/706,171

(22) Filed: Dec. 6, 2019

Related U.S. Application Data

(60) Provisional application No. 62/776,932, filed on Dec. 7, 2018.

(51) Int. Cl.
*G01Q 60/14* (2010.01)
*G01R 33/038* (2006.01)
*G01Q 10/06* (2010.01)
*G01Q 60/54* (2010.01)

(52) U.S. Cl.
CPC ............ *G01Q 60/14* (2013.01); *G01Q 10/06* (2013.01); *G01R 33/0385* (2013.01); *G01Q 60/54* (2013.01)

(58) Field of Classification Search
CPC ........ G01Q 60/14; G01Q 60/54; G01Q 10/06; G01R 33/0385
See application file for complete search history.

(56) References Cited

U.S. PATENT DOCUMENTS

2014/0230876 A1* 8/2014 Kirihara .................. H01L 37/04
                                                      136/242

OTHER PUBLICATIONS

P. Willke, et al.; "Spatial extent of a Landauer residual-resistivity dipole in graphene quantified by scanning tunnelling potentiometry"; Nature Communications; 6:6399; DOI: 10.1038/ncomms7399; Published Mar. 6, 2015; pp. 1-5.
W. Wang, et al.; "Local Transport Measurements at Mesoscopic Length Scales Using Scanning Tunneling Potentiometry"; Physical Review Letters; 110, 236802; published Jun. 4, 2013; pp. 1-5.

* cited by examiner

*Primary Examiner* — Nicole M Ippolito
*Assistant Examiner* — Hanway Chang
(74) *Attorney, Agent, or Firm* — Rosenberg, Klein & Lee

(57) ABSTRACT

A scanning tunneling microscopy based potentiometry system and method for the measurements of the local surface electric potential is presented. A voltage compensation circuit based on this potentiometry system and method is developed and employed to maintain a desired tunneling voltage independent of the bias current flow through the film. The application of this potentiometry system and method to the local sensing of the spin Hall effect is outlined herein, along with the experimental results obtained.

24 Claims, 10 Drawing Sheets

SYSTEM AND METHOD FOR PERFORMING SCANNING TUNNELING MICROSCOPY ON CURRENT-CARRYING SAMPLES

REFERENCE TO RELATED PATENT APPLICATIONS

The present disclosure claims priority from U.S. provisional patent application No. 62/776,932, filed Dec. 7, 2018, the entirety of which is hereby incorporated by reference.

STATEMENT REGARDING FEDERAL SPONSORED RESEARCH OR DEVELOPMENT

This invention was made with government support under H9823016C0169 awarded by NSA. The government has certain rights in the invention.

BACKGROUND

The technology disclosed herein relates to a system and method for taking measurements of a current-carrying sample based on scanning tunneling spectroscopy. In certain embodiments of this technology, the non-contact surface potential measurement (potentiometry) method utilizes a constant tunneling gap voltage scanning tunneling microscope (STM) system employing a custom voltage compensation circuit. In certain embodiments, the voltage compensation circuit can be used to maintain a desired tunneling voltage independent of the bias current flow through a film. The flexibility of this disclosed system and method makes them suitable for use with nearly any standard STM. In certain embodiments, this system is capable of fully characterizing the resistivity of conducting films and the uniformity of resistivity at the nanoscale. In other embodiments a system such as the one described herein is indispensable for the application of STM to the measurement of a current-carrying sample. One example application of this disclosed system and method is to sense the spin Hall effect.

Recent technological progress has resulted in the reduction of the dimensions of electronic and magnetic devices to the nanoscale. One of the many challenges associated with this nanoscale reduction is to develop reliable techniques for the measurement of local electrical properties of materials. To handle this problem, various techniques have been proposed to measure the local surface potential at the nanoscale and used in studies of graphene and other materials.

Scanning tunneling potentiometry (STP) is a non-contact technique to detect the local surface potential on a current-carrying sample. A technique for using a scanning tunneling microscopy (STM) for STP has opened up opportunities to simultaneously study the electron transport properties and topographic information at a nanoscale level. Due to that capability, the development and the use of STP has attracted much attention in recent years.

In this disclosure, there is described a non-contact surface potential measurement (potentiometry) method by employing the scanning tunneling spectroscopy (STS) function of a scanning tunneling microscope (STM). Since the STS is usually an embedded function in common STM systems, this potentiometry method requires no further modification of an STM system electronics, only the addition of a second contact to the sample and a bias current source connected thereto. This makes the technique readily accessible for virtually all STMs. It is demonstrated herein that this potentiometry technique has a sub-millivolt resolution of surface potential measurements and nanometer resolution in positioning. As a result, the resistivity of conducting films (and its uniformity) can be fully characterized at the nanoscale. Additionally, a voltage compensation technique based on the potentiometry, which is able to maintain a desired tunneling voltage independent of the applied bias current, is additionally disclosed herein. This technique is further applied to the STM based study of the spin Hall effect (SHE) in tungsten films.

SUMMARY

A system for studying spin Hall effect in any of a conductive thin film or semiconductor thin film is provided. The system includes a test sample formed of one of a conductive thin film or semiconductor thin film. The test sample has a pair of conductive contacts respectively disposed on a pair of longitudinally spaced portions of the test sample. The system further includes a scanning tunneling microscope that has a voltage source and a sensing tip spaced from the test sample to define a gap therebetween. Further, the system includes a current source having an output coupled to a first of the pair of conductive contacts to provide a bias current to the test sample. Still further, the system includes a voltage compensation circuit coupled to the pair of conductive contacts and the voltage source for varying a voltage input to the second of the pair of conductive contacts to provide an input voltage to the test sample compensated so as to maintain a voltage across the gap that is independent of changes in the bias current.

From another aspect, a method of using a scanning tunneling microscope to study spin Hall effect in any of a conductive thin film or semiconductor thin film is provided. The method includes providing a scanning tunneling microscope, and preparing a test sample formed of one of a conductive thin film or semiconductor thin film. The method further includes positioning a sensing tip of the scanning tunneling microscope in correspondence with the test sample and spaced therefrom to define a gap therebetween through which a tunneling current will pass. Further, the method includes connecting an output of a current source to a first portion of the test sample to provide a bias current to the test sample, and connecting an input voltage, that is varied to maintain a voltage across the gap that is independent of changes in the bias current supplied from the current source, to a second portion of the test sample. The second portion of the test sample is longitudinally displaced from the first portion. Still further, the method includes maintaining the sensing tip at a selected position, and applying bias current pulses of selected magnitude with voltages across the gap of opposing polarity while measuring the tunneling current during a selected time period. The method yet further includes comparing the measured tunneling current versus time for each polarity of the gap voltages.

From a further aspect, a method of preparing a scanning tunneling microscope for the study of spin Hall effect in a test sample formed of any of a conductive thin film or semiconductor thin film is provided. The scanning tunneling microscope has a voltage source and a sensing tip configured to be spaced from the test sample to define a gap therebetween. The method includes providing a current source with an output configured to be coupled to a first longitudinal portion of the test sample to provide a bias current to the test sample. Further, the method includes providing a voltage compensation circuit coupled to the first longitudinal portion and a second longitudinally displaced portion of the test sample, and to the voltage source for varying a voltage input to the second portion of the test sample to provide an input voltage to the test sample compensated to maintain a voltage across the gap that is independent of changes in the bias current.

DETAILED DESCRIPTION

Figure 1:
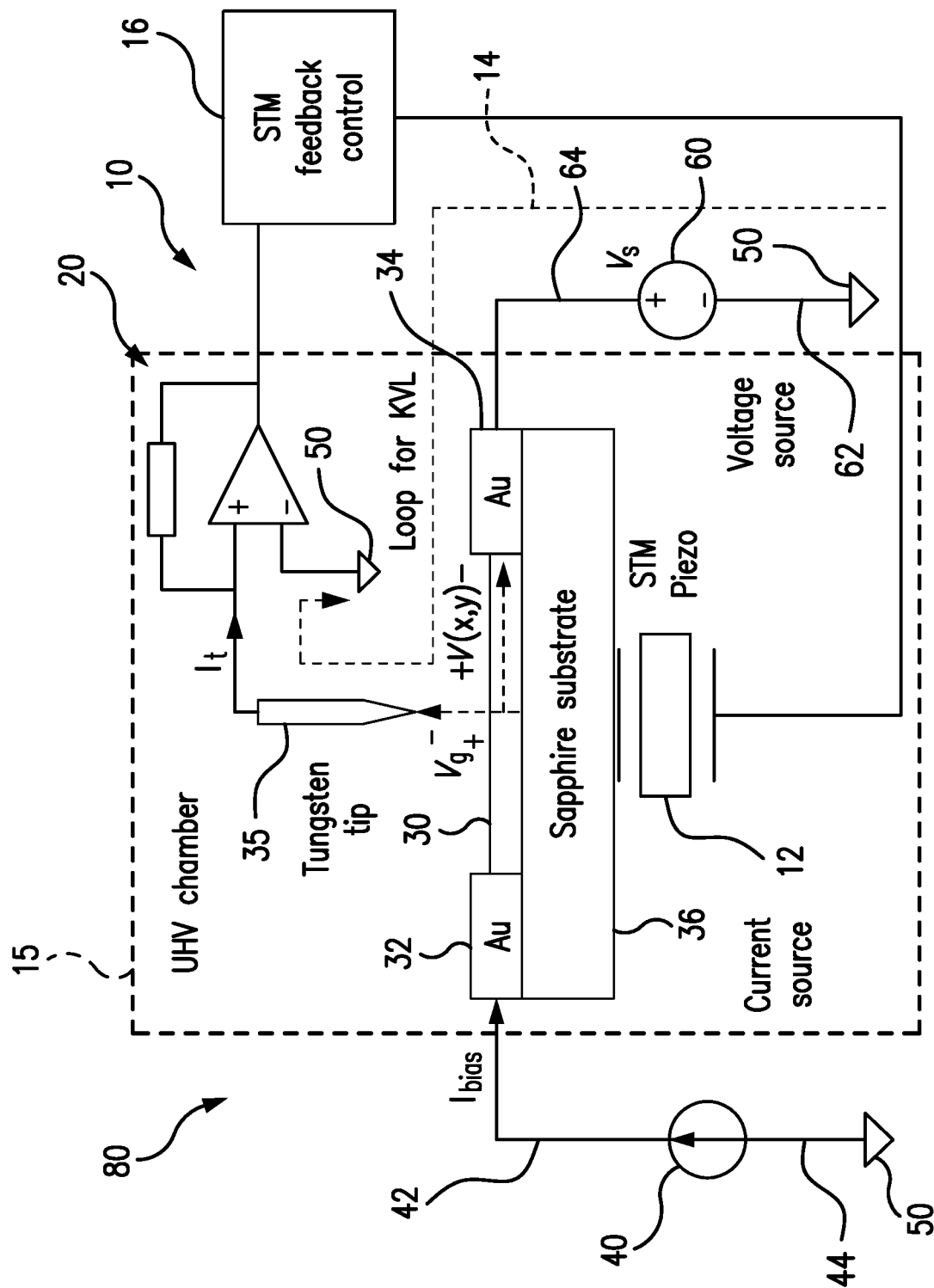
FIG. 1 is a schematic diagram of a known scanning tunneling microscope system capable of carrying out a potentiometry analysis of a sample.

Referring to FIG. 1, the potentiometry technique is illustrated using a scanning tunneling microscope (STM) 10, a 5 nm-thick tungsten film sample 30 on a sapphire substrate 36 was fabricated using DC magnetron sputtering and analyzed in-situ under ultra-high vacuum conditions in an ultra-high vacuum chamber 15. As shown in the figure, one terminal 34 connected to the thin film sample 30 is connected to the voltage source 60 through the conductor 64, which terminal and connection are conventional in the STM 10. The other conductor 62 of the voltage source 60 is coupled to the system common or ground terminal 50. The terminal 32 that is connected to an opposing longitudinal end of the thin film sample 30 is in turn connected to a current source 40 by a conductor 42 and are added to the conventional STM 10 configuration in order to produce the STM potentiometry system 80 which provides the capability to perform the potentiometry technique. Another conductor or terminal 44 of the current source 40 is coupled to the system common or ground terminal 50. The added connection terminal 32 and connected current source 40 control a tunneling gap voltage ($V_g$) and supply a desired bias current ($I_{bias}$) through the tungsten thin film sample 30, respectively.

The flow of the bias current $I_{bias}$ results in a voltage drop along the tungsten thin film sample 30. To detect the potential at any (x, y)-location on the sample, the following measurement procedure was implemented based on scanning tunneling spectroscopy (STS). The measurement starts by parking the STM sensing tip 35 at the desired (x, y)-location. Then, the feedback loop of the STM potentiometry system 80, consisting of the preamplifier 20, the STM feedback control circuit 16 and piezoelectric transducer 12, is turned off to freeze the thin film sample 30 and sensing tip 35 at their desired positions, i.e. to eliminate any possible mechanical movements. The feedback loop is part of the standard circuitry in an STM. Next, the tunneling current $I_t$ is measured at different values of the source voltage $V_s$. As the measurement of the tunneling current and source voltage are embedded functions in common STM systems, the STM circuitry for that function is not shown herein. After the measurement of the $I_t$-$V_s$ curve data is performed, the feedback loop is switched on and the sensing tip 35 can be moved to other locations for further measurements of the potential. For the data collection disclosed herein, the terminal 34 of the thin film sample 30 connected to the voltage source 60 is used as the reference point for the surface potential. The bias-current-induced surface potential is determined from the obtained $I_t$-$V_s$ curves by applying Kirchhoff's voltage law (KVL) to the loop, consisting of the voltage source 60, the surface potential being measured $V_{x-y}$, the tunneling gap voltage $V_g$, and the voltage drop across the STM tip, which loop is indicated by the broken dash line 14 in FIG. 1. Since the STM tip 35 is virtually grounded by the pre-amplifier 20, the KVL equation for the above loop can be written as follows $$V_s + V(x,y) = V_g + I_t \cdot R_{tip}, \quad (1)$$

where $V_s$ is the source voltage, $V(x, y)$ is the voltage between the tunneling location and the reference point 34, $V_g$ is the tunneling gap voltage, $I_t$ is the tunneling current, and $R_{tip}$ is the tip resistance. It is apparent that a tunneling current of zero corresponds to zero tunneling gap voltage. Therefore, the right-hand side of equation (1) is equal to zero when $I_t=0$. In this case, the surface potential $V(x, y)=-V_s$, where the value of $V_s$ at which $I_t=0$ can be found by locating the intersection of the $I_t$-$V_s$ curve with the $I_t=0$ line.

Figure 2A:
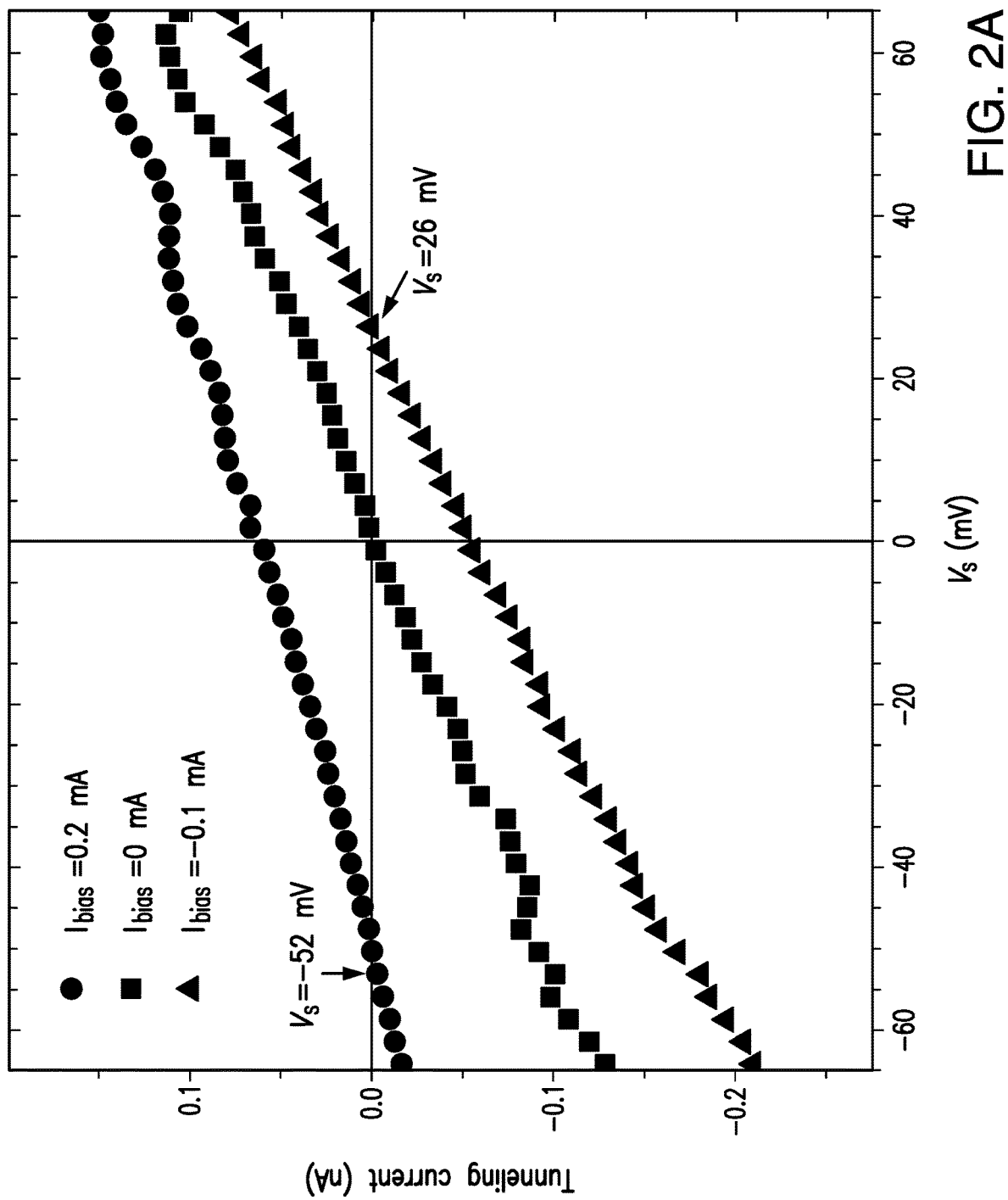
FIG. 2A is a graphical representation of current vs. voltage measurements with different bias currents at one sampled location of the test sample using the system of FIG. 1.
Figure 2B:
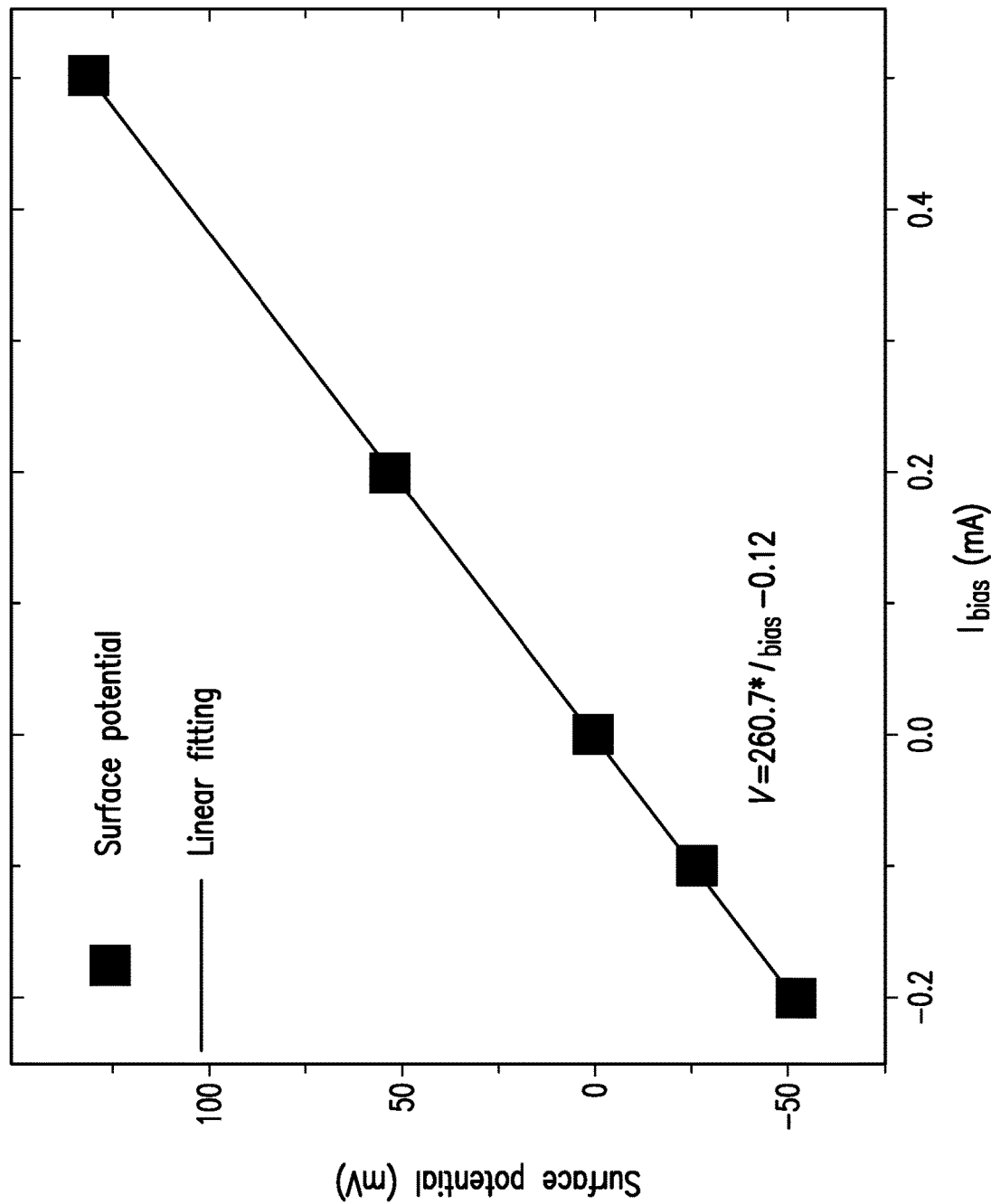
FIG. 2B is a graphical representation of the surface potential of the location measured in FIG. 2A for the test sample using the system of FIG. 1.
Figure 2C:
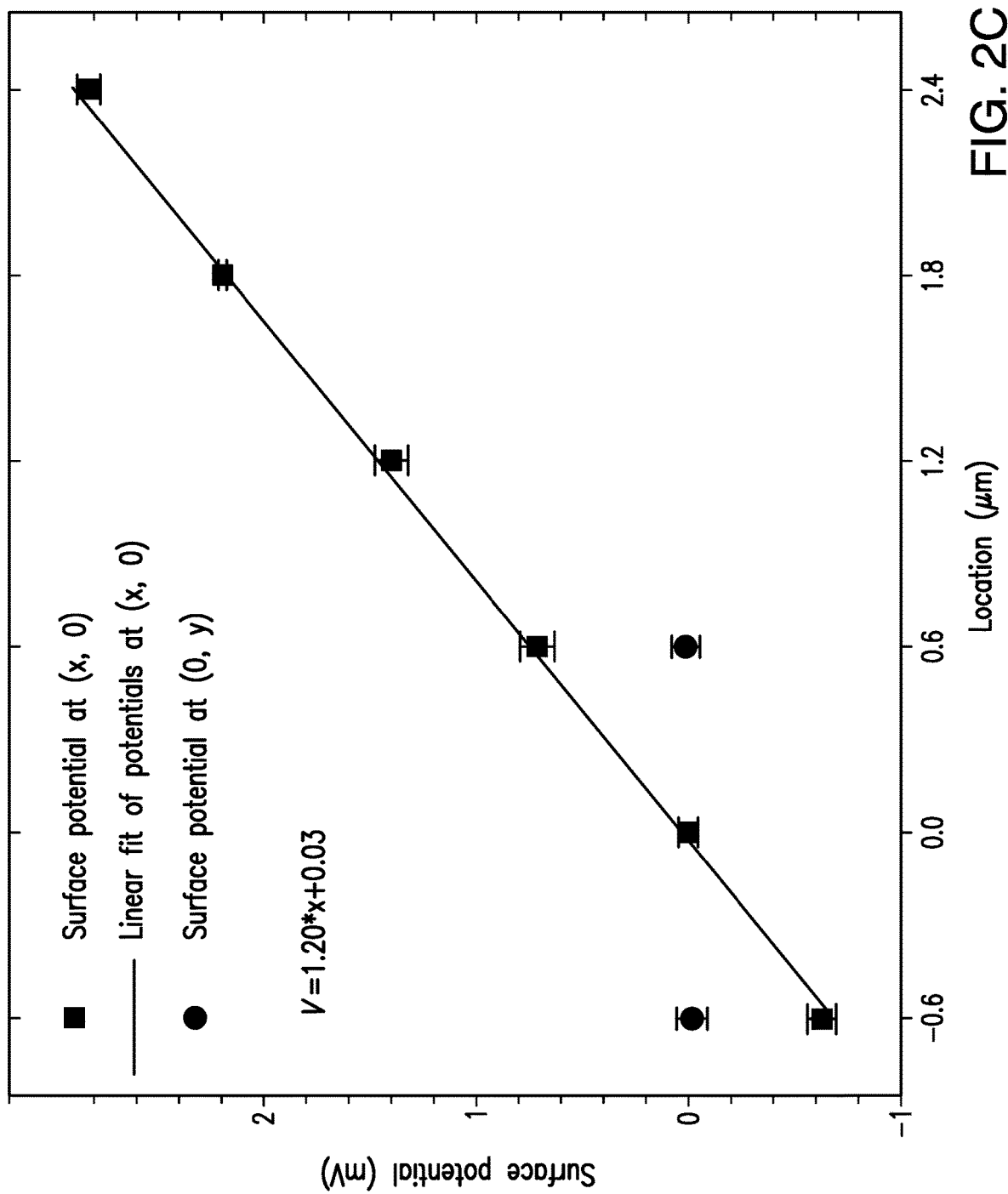
FIG. 2C is a graphical representation of surface potentials at various locations of the test sample at a single bias current using the system of FIG. 1.

Typical $I_t$-$V_s$ curves obtained at $I_{bias}=0$ mA, 0.2 mA and −0.1 mA are shown in FIG. 2A with the tip 35 held at one location on the tungsten thin film sample 30. By identifying the intersections of these curves with the $I_t=0$ line, the surface potentials due to the above bias currents are found to be 0 mV, 52 mV, and −26 mV, respectively. The surface potential at any fixed location is a linear function of $I_{bias}$. Hence, by applying a linear approximation (linear fit) to the data, shown in FIG. 2B, the resistance was determined to be approximately 260.7Ω between the tunneling location and the reference point 34. Surface potentials measured at different (x, y)-locations on the tungsten thin film sample 30 at a constant bias current reveal the resistivity of the tungsten film. The results of those measurements are illustrated in FIG. 2C. The potential gradient in the x-direction (longitudinal direction) is found to be 1.20 mV/μm at $I_{bias}=10$ mA. In fact, the good linear fit of the surface potentials measured at various locations indicates a good uniformity in the thickness of the deposited thin film sample 30. Since the x-direction is parallel to the direction of the current flow, the resistivity of the film can then be estimated to be 240 μΩ·cm for the thin tungsten thin film sample 30 with a cross-section of 5 nm×4 mm. This high resistivity is a fingerprint of a β-phase tungsten film, and it is consistent with the results reported in the literature. As expected, the potentiometry measurements along the y-axis at (x, y)=(0 μm, 0 μm), (0 μm, −0.6 μm), and (0 μm, 0.6 μm) showed no potential differences because the y-direction is perpendicular to the longitudinal current flow direction.

Figure 3:
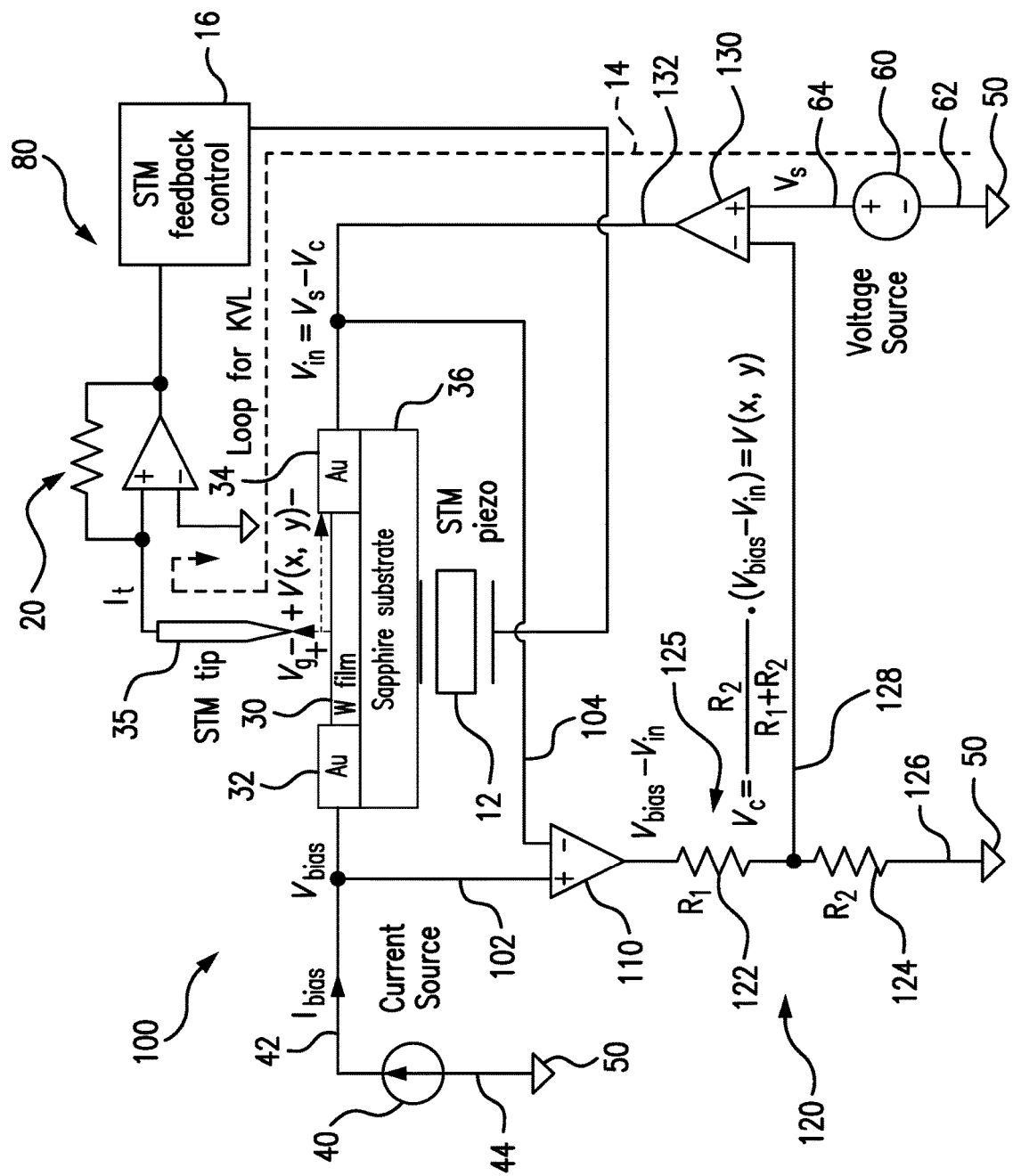
FIG. 3 is a schematic diagram of the scanning tunneling microscope of FIG. 1 incorporating a voltage compensation circuit.

A constant tunneling gap voltage STM system 100 includes the STM potentiometry system 80 employed in the above described potentiometry technique, discussed with respect to FIG. 1, and makes possible the STM based study of the spin Hall effect (SHE) in conducting films, which is currently of great interest in spintronics research. The SHE manifests itself in the accumulation of the spin-polarized electrons at the surface of a current-carrying sample. In the STM study of the SHE, it is very important to maintain a constant tunneling gap voltage between the tip 35 and the conducting thin film sample 30 in the presence of current flow through the film, which current flow can be achieved by using the STM potentiometry system 80. The constant tunneling gap voltage STM 100 neglects the very small term $I_t \cdot R_{tip}$ (~nV) in equation (1), and provides a desired tunneling gap voltage $V_g$ with a voltage compensation circuit 120 added to the STM potentiometry system 80 shown in FIG. 1. The constant tunneling gap voltage STM system 100 for use in the study of SHE is shown in FIG. 3.

The compensation circuit 120 of system 100 employs two differential-input operational amplifiers (op-amps) 110 and 130 and a voltage divider 125 formed by the resistors 122 and 124, having respective resistance values $R_1$ and $R_2$. The first differential-input op-amp 110 has a non-inverting terminal input line 102 coupled to the bias current input line 42 and an inverting terminal input line 104 coupled to the source voltage input line 132. Accordingly, the output voltage of the first differential-input op-amp 110 represents the voltage drop $(V_{bias}-V_{in})$ across the thin film sample 30. This output voltage is then attenuated by the voltage divider 125, thereby scaling the output for feedback to adjust the magnitude of source voltage supplied to the terminal 34 connected to the thin film sample 30.

The output voltage of the first differential-input op-amp 110 is multiplied by the voltage divider resistance ratio $R_2/(R_1+R_2)$ to become the compensation voltage $V_c=(V_{bias}-V_{in})(R_2/(R_1+R_2))$ and applied through the inverting terminal input line 128 of the second differential-input op-amp 130. The value of the resistance ratio $R_2/(R_1+R_2)$ is chosen to be equal to the ratio $V(x, y)/(V_{bias}-V_{in})$, resulting in the compensation voltage $V_c$ being equal to $V(x, y)$ and the resistance $R_1$ of resistor 122 is adjustable to set the value of the resistance ratio to obtain the desired $V_c$. This compensation voltage $V_c$ is then subtracted from the output voltage $V_s$ of voltage source 60 applied to the second differential-input op-amp 130 through the conductor 64 to the non-inverting terminal input thereof. As a result, the tunneling gap voltage $V_g=V_s-V_c+V(x, y)=V_s$. Since the voltage ratio $V(x, y)/(V_{bias}-V_{in})$ is not affected by changing the value and the direction of $I_{bias}$, therefore, this compensation circuit 120 allows a desired tunneling gap voltage $V_g$ to be applied independently of the $I_{bias}$ current.

Figure 4A:
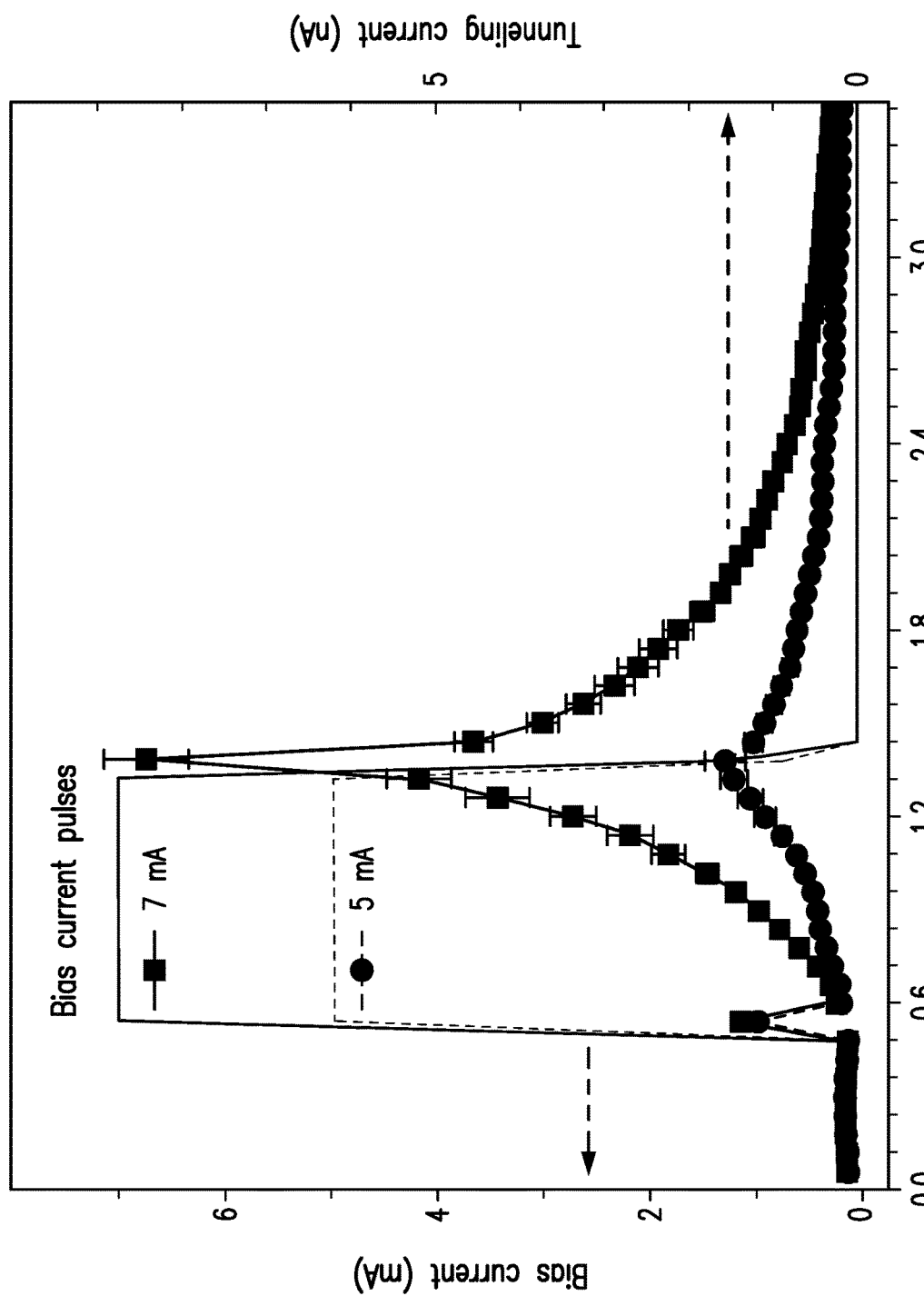
FIG. 4A is a graphical representation of tunneling current measurements with bias current pulses of different amplitudes.
Figure 4B:
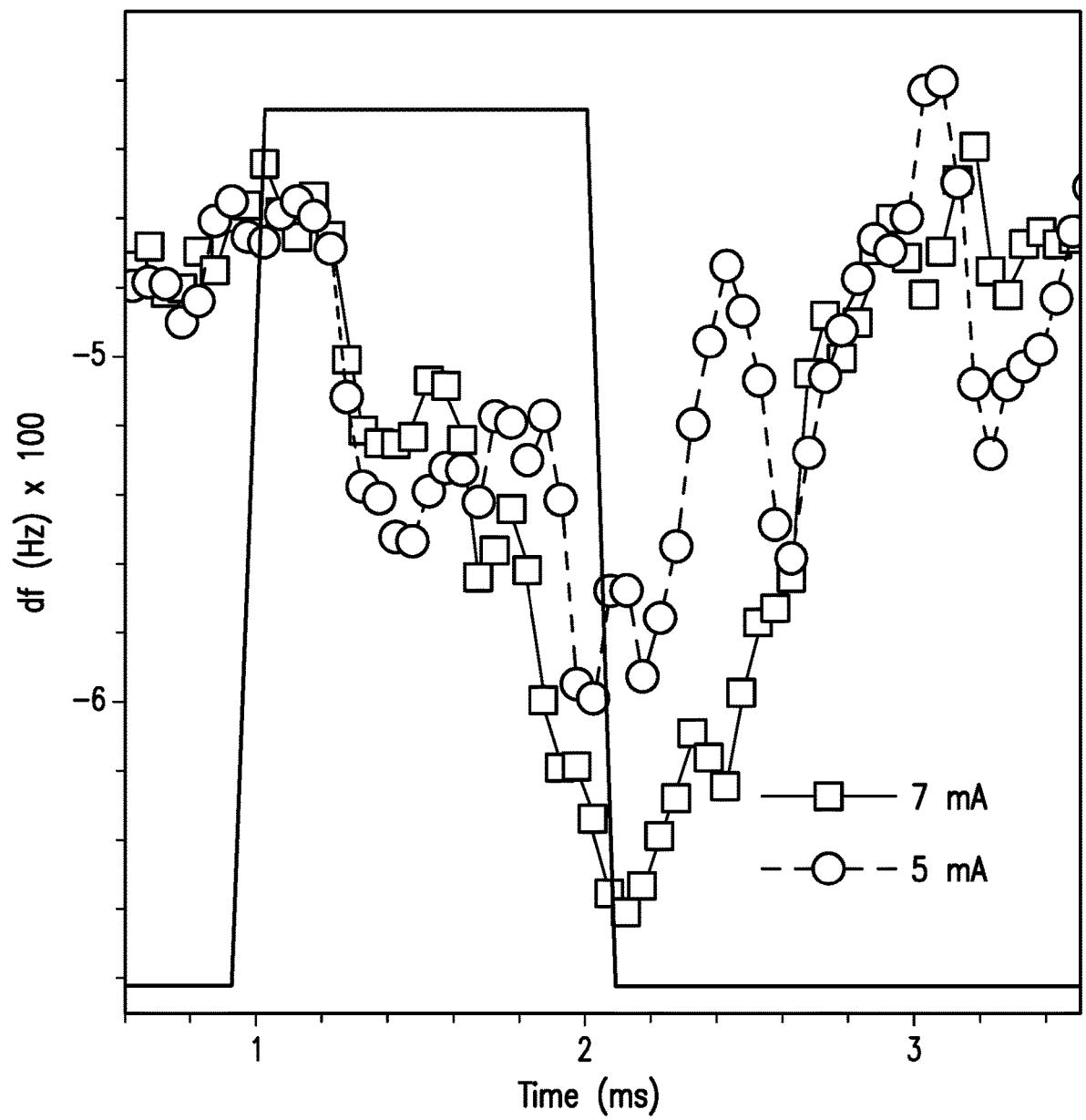
FIG. 4B is a graphical representation of an atomic force microscopy study on the test sample in the presence of identical bias current pulses.

Using system 100, an STM study of the SHE was performed using tungsten films and tungsten tips. In the study, the tunneling current was measured in the presence of a bias current pulse (~1 ms) at a constant tunneling voltage of 0.5 V for all measurements and with the STM feedback turned off to freeze the position of the tungsten tip 35 and tungsten thin film sample 30. FIG. 4A shows the tunneling currents in the presence of bias current pulses with different amplitudes and with a constant gap voltage. The study resulted in two distinct phenomena being observed. First, there was a substantial and gradual increase in the tunneling current as a function of time, as shown in FIG. 4A. This can be attributed to a change in the tip-sample distance (tunneling gap) in the presence of the bias current through the tungsten thin film sample 30. These gradual tunneling gap changes have been confirmed by using atomic force microscopy (AFM), the results of which are presented in FIG. 4B. The shift of the cantilever resonant frequency (df) seen in FIG. 4B is caused by the decrease in the tunneling gap during the $I_{bias}$ pulse. These tunneling gap changes are most likely caused by local thermal expansion.

Figure 4C:
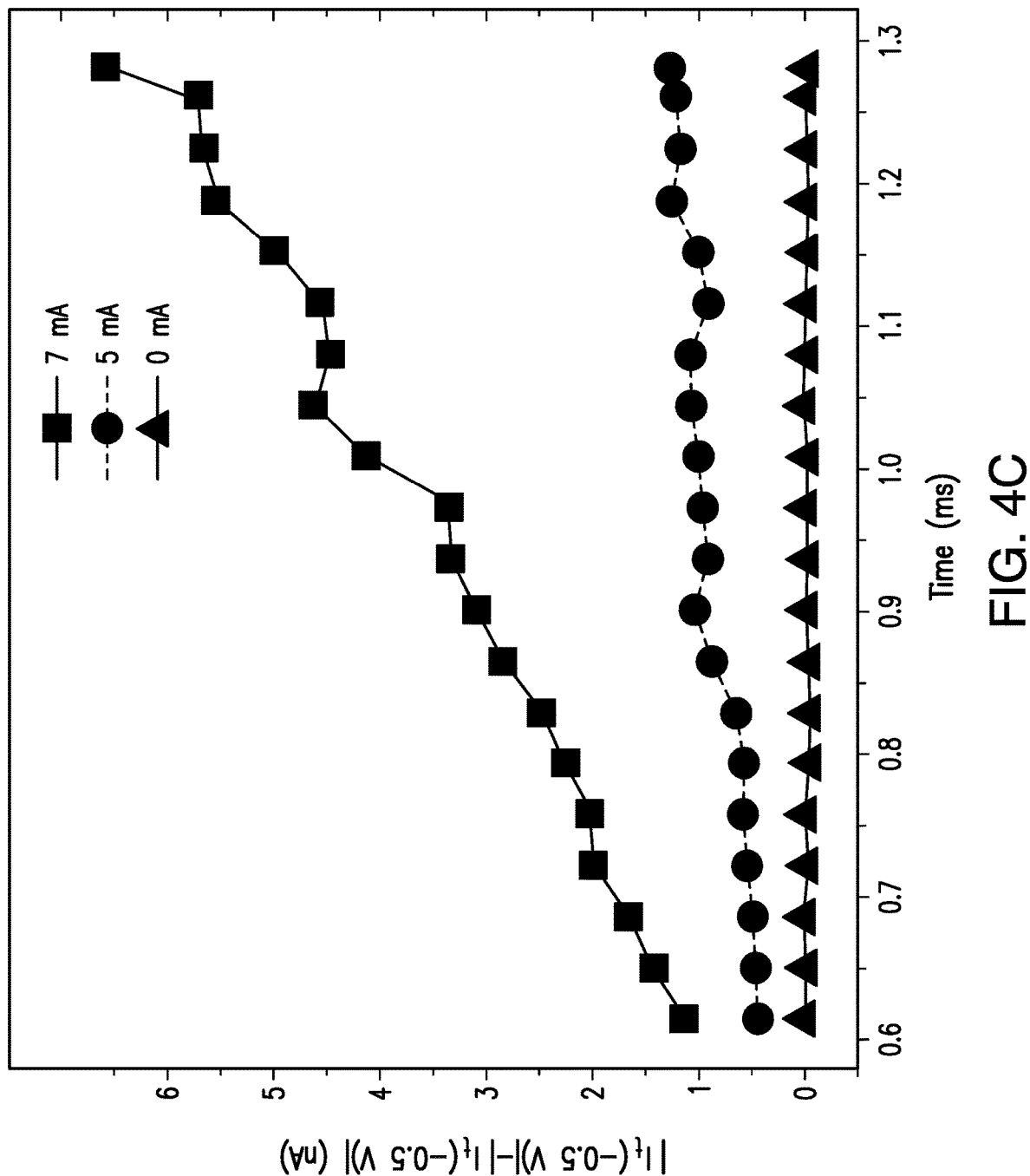
FIG. 4C is a graphical representation of tunneling currents measured at two tunneling voltages of opposite polarity.

The second of the phenomena observed, was an asymmetry in the tunneling currents caused by reversing the polarity of the tunneling gap voltage in the presence of the same bias current pulses, as shown in FIG. 4C. The graphs this figure show the difference in the tunneling currents measured independently at −0.5 V and 0.5 V, each with an identical bias current flow through the thin film sample 30. The difference with no bias current (0 mA) is almost zero while the differences increase in time in the presence of 5 mA and 7 mA bias currents. This temporal increase in the difference is due to the increase in the tunneling current caused by the bias current as discussed with respect to FIG. 4A. Therefore, the temporal increase can be eliminated by normalizing the difference in the tunneling currents measured at −0.5 V and 0.5 V to their mean values.

Figure 4D:
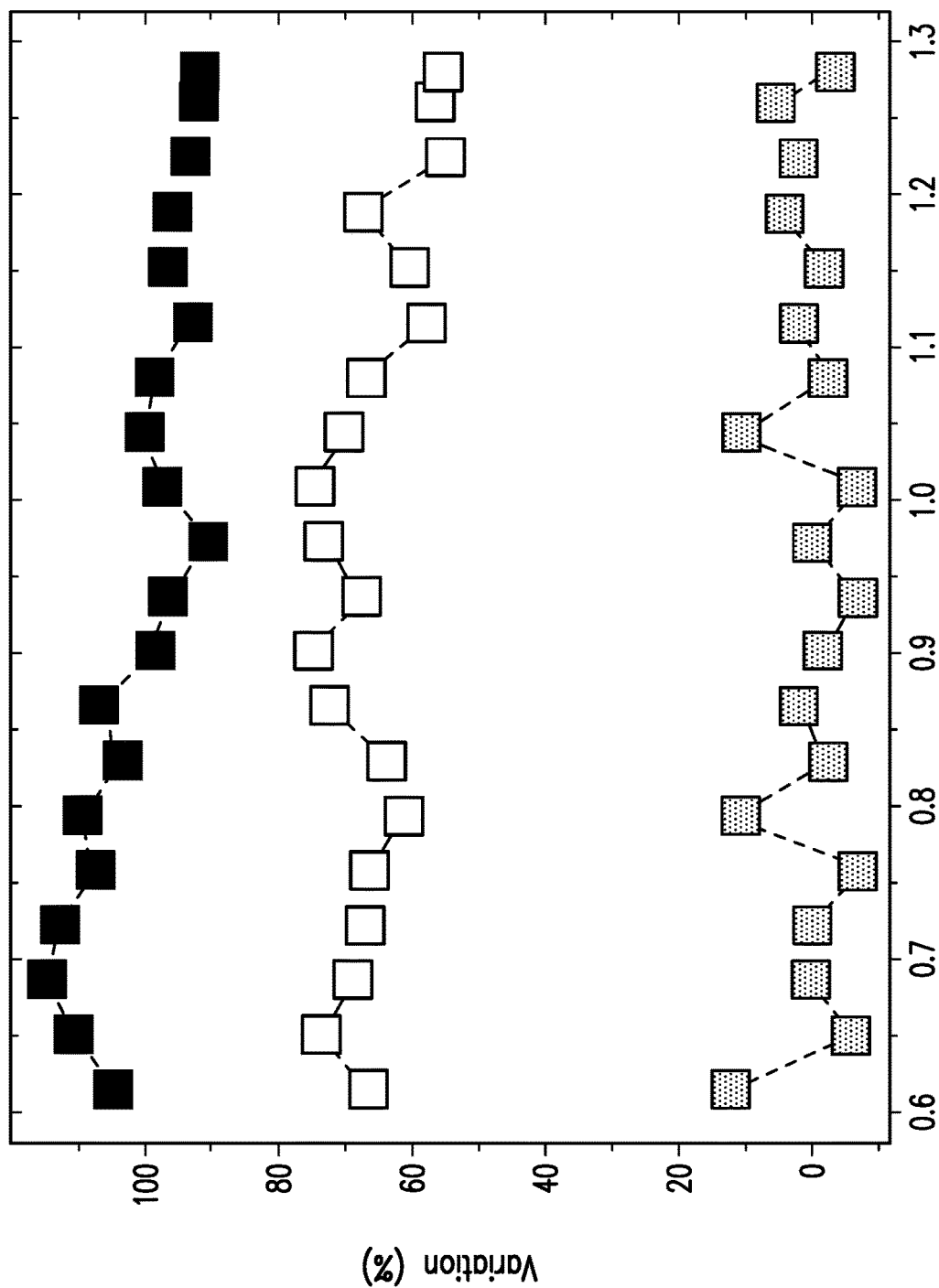
FIG. 4D is a graphical representation of the normalized difference to the mean of the tunneling currents measured the two tunneling voltages of opposite polarity.

FIG. 4D shows the normalized results of the measurements presented in FIG. 4C. The normalized results clearly indicate a bias-current-induced asymmetry in the tunneling currents measured at different polarities of the tunneling voltages. This asymmetry can be explained by the asymmetry in the tunneling process caused by the SHE. Indeed, on the one hand, when the polarity of the tunneling gap voltage is such that electrons tunnel from the tungsten thin film sample 30, we deal with the tunneling of electrons which are spin-polarized due to the SHE. On the other hand, when the polarity of the tunneling voltage is such that electrons tunnel from the tip 35 to the film, we deal with the tunneling of non-spin-polarized electrons. The fact that this asymmetry is enhanced by the increase in the bias current through the film, as indicated by the measurements presented in 4D, also supports the conclusion that this asymmetry is related to the SHE.

Figure 4E:
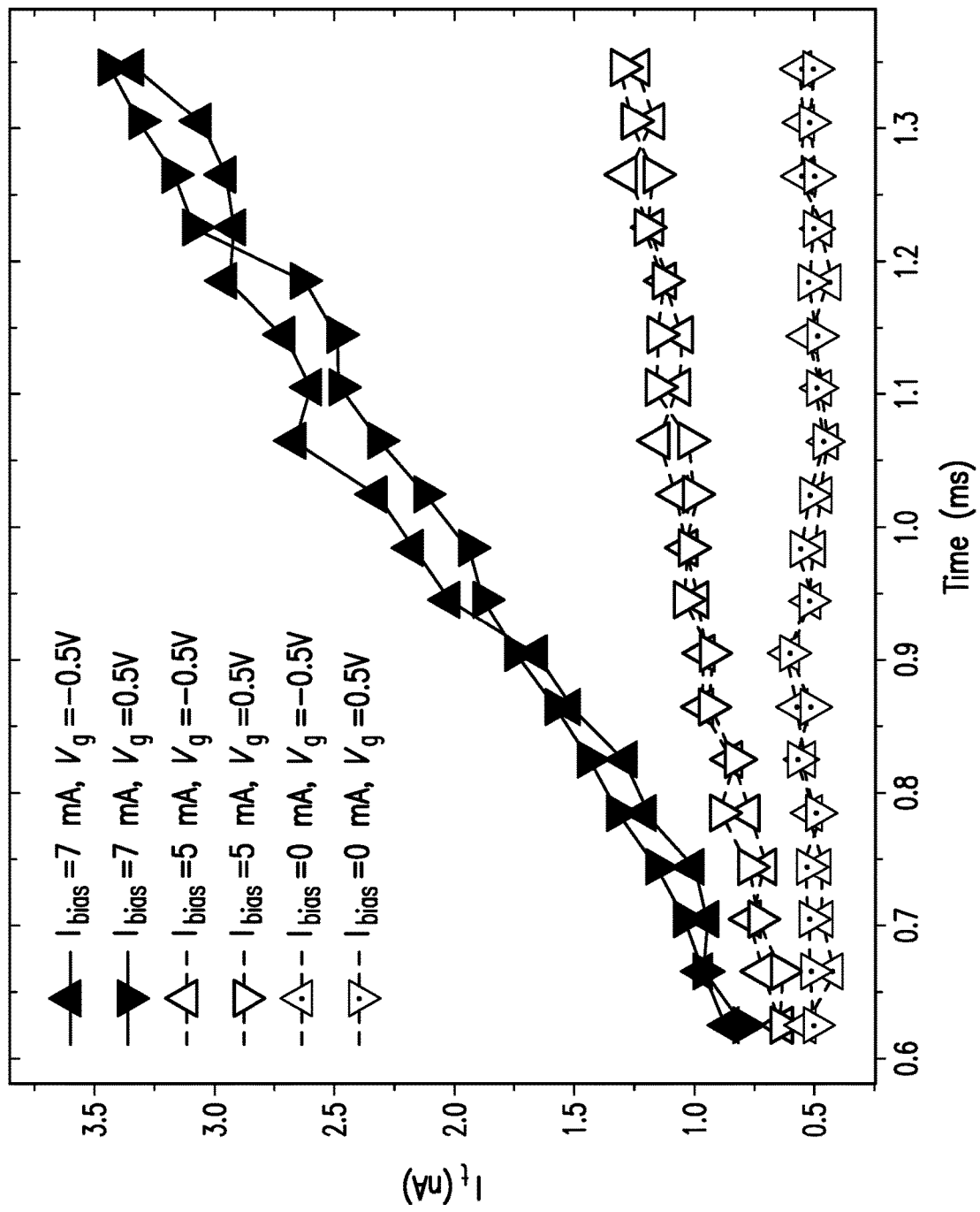
FIG. 4E is a graphical representation of tunneling currents measured on a gold contact area with different bias currents and the two tunneling voltages of opposite polarity

Furthermore, as a control sample, this method was repeated on a position of a gold contact 32, 34 of the 5 nm tungsten thin film sample 30, the results of which are presented in FIG. 4E. The measurements presented in this figure reveals the absence of the asymmetry in tunneling currents between the gold contact 32, 34 and the tungsten tip 35 in the presence of different bias currents and tunneling voltages of 0.5 V and −0.5 V. These results were obtained for the gold contact 32, 34 of the same tungsten thin film sample 30 which exhibited the asymmetry in tunneling currents, shown in FIG. 4C, by using the same STM tip 35 and system 100. It is clear from FIG. 4E that there is an absence of asymmetry in the tunneling currents with respect to the change of the polarity of the tunneling voltage in the presence of bias currents. This absence of asymmetry in the tunneling currents is consistent with the reduction of spin-orbit coupling (SOC) caused by the reduced electric field.

The expression for the Hamiltonian of the SOC is given by the formula, $$\hat{H} = \frac{h}{4m^2c^2}(E \times \hat{p}) \cdot \hat{\sigma} \tag{2}$$

where m is mass of the particle, c is the speed of light, E is the electric field, $\hat{p}$ is the momentum operator and $\hat{\sigma}$ is the spin operator. The reduction in the electric field E occurs because gold contact is a much thicker (~1 μm) and more conductive in comparison with the tungsten film. It is worthwhile to mention that the SOC is regarded as the very origin of the SHE. Thus, this control experiment performed on the gold area precludes any possible experimental flaw to be the cause of the observed asymmetry from the tungsten film Based on these facts, it is believed that the described experimental results suggest that the local STM sensing of the SHE in conducting films can be achieved employing the constant tunneling gap voltage STM system 100 using the above described potentiometry method.

In summary, a potentiometry system and method for the measurement of the surface potential in a conducting film with a common STM system has been described and experimentally illustrated. A feature of this method is the use of the built-in STS function to detect bias-current-induced surface potentials. In this way, an STM system can be easily configured by the addition of a second connection contact on the sample and the addition of a bias current source to characterize the resistivity of a sample and its thickness uniformity at the nanoscale. It is also demonstrated that this potentiometry system can be further modified to form a constant tunneling gap voltage STM system that is instrumental for the local STM study of the SHE. It is also apparent that the presented constant tunneling gap voltage STM system and potentiometry method carried out therewith opens the opportunity for the study of transport phenomena at the nanoscale in conducting and semiconductor films.

The descriptions above are intended to illustrate possible implementations of the system and method disclosed herein and are not restrictive. While the system and method disclosed herein have been described in connection with specific forms and embodiments thereof, it will be appreciated that various modifications other than those discussed above may be resorted to without departing from the spirit or scope thereof. Such variations, modifications, and alternatives will become apparent to the skilled artisan upon review of the disclosure. For example, functionally equivalent elements may be substituted for those specifically shown and described, and certain features may be used independently of other features, and in certain cases, particular locations of elements may be reversed or interposed, all without departing from the spirit or scope of that which is defined in the appended Claims. The scope of this disclosure should therefore be determined with reference to the description above, the appended claims and drawings, along with their full range of equivalents.

What is being claimed is:

1. A system for studying spin Hall effect in any of a conductive thin film or semiconductor thin film, comprising:
   a test sample formed of one of a conductive thin film or semiconductor thin film, the test sample having a pair of conductive contacts respectively disposed on a pair of longitudinally spaced portions of the test sample;
   a scanning tunneling microscope having a voltage source and a sensing tip spaced from the test sample to define a gap therebetween;
   a current source having an output coupled to a first of the pair of conductive contacts to provide a bias current to the test sample; and
   a voltage compensation circuit coupled to the pair of conductive contacts and the voltage source for varying a voltage input to the second of the pair of conductive contacts to provide an input voltage to the test sample compensated to maintain a voltage across the gap that is independent of changes in the bias current.

2. The system as recited in claim 1, wherein the voltage compensation circuit includes a first operational amplifier having a first input coupled to the first of the pair of conductive contacts for input of a bias voltage and second input coupled to the second of the pair of contacts, the first operational amplifier having an output voltage corresponding to a voltage drop across the test sample.

3. The system as recited in claim 2, wherein the voltage compensation circuit includes a second operational amplifier having a first input coupled to the voltage source for input of a source voltage thereof and a second input coupled to the output of the first operational amplifier for input of a compensation voltage, the second operational amplifier having an output coupled to the second of the pair of conductive contacts to supply the input voltage thereto.

4. The system as recited in claim 3, wherein the voltage compensation circuit further includes an attenuation circuit coupled between the output of the first operational amplifier and the second input of the second operational amplifier.

5. The system as recited in claim 4, wherein the attenuation circuit is a voltage divider having at least one variable resistance element.

6. The system as recited in claim 5, wherein the voltage divider comprises a first resistor coupled on one end thereof to the output of the first operational amplifier and an opposing end coupled to one end of a second resistor and defining a node thereat, the node being coupled to the second input of the second operational amplifier to provide the compensation voltage thereto.

7. The system as recited in claim 1, wherein the voltage compensation circuit includes a first differential operational amplifier having a non-inverting input coupled to the output of the current source for input of a bias voltage and an inverting input coupled to the second of the pair of contacts, the first differential operational amplifier having an output voltage corresponding to a voltage drop across the test sample.

8. The system as recited in claim 7, wherein the voltage compensation circuit includes a second differential operational amplifier having a non-inverting input coupled to the output the voltage source for input of a source voltage thereof and an inverting input coupled to the output of the first differential operational amplifier, the second differential operational amplifier having an output coupled to the second of the pair of conductive contacts to supply the input voltage thereto.

9. The system as recited in claim 7, wherein the voltage compensation circuit includes an attenuation circuit coupled to the output of the first differential operational amplifier for providing a reduced magnitude output corresponding to voltage drop across the test sample.

10. The system as recited in claim 9, wherein the voltage compensation circuit further includes a second differential operational amplifier having a non-inverting input coupled to the output the voltage source for input of a source voltage thereof and an inverting input coupled to the output of the attenuation circuit, the second differential operational amplifier having an output coupled to the second of the pair of conductive contacts to supply the input voltage thereto.

11. A method of using a scanning tunneling microscope to study spin Hall effect in any of a conductive thin film or semiconductor thin film, comprising:
   providing a scanning tunneling microscope;
   preparing a longitudinally extended test sample formed of one of a conductive thin film or semiconductor thin film;

positioning a sensing tip of the scanning tunneling microscope in correspondence with the test sample and spaced therefrom to define a gap therebetween through which a tunneling current will pass;

connecting an output of a current source to a first portion of the test sample to provide a bias current to the test sample;

connecting an input voltage that is varied to maintain a voltage across the gap that is independent of changes in the bias current supplied from the current source to a second portion of the test sample, the second portion of the test sample being longitudinally displaced from the first portion;

maintaining the sensing tip at a selected position;

applying bias current pulses of selected magnitude from the current source with voltages across the gap of opposing polarity while measuring the tunneling current during a selected time period; and comparing the measured tunneling current versus time for each polarity of the voltages across the gap.

12. The method as recited in claim 11, wherein connecting an input voltage to a second portion of the test sample includes coupling a voltage compensation circuit to the first and second portions of the test sample and to a voltage source, the voltage compensation circuit providing the input voltage to the second portion of the test sample.

13. The method as recited in claim 12, wherein coupling a voltage compensation circuit includes connecting inputs of a first operational amplifier to the first and second portions of the test sample for determining voltage drop across the test sample and establishing a compensation voltage in response thereto.

14. The method as recited in claim 13, wherein coupling a voltage compensation circuit includes providing a second operational amplifier having a first input coupled to the voltage source and a second input coupled to the first operational amplifier for input of the compensation voltage thereto, an output of the second operational amplifier being coupled to the second portion of the test sample to provide the input voltage that is varied to maintain a voltage across the gap that is independent of changes in the bias current supplied from the current source.

15. The method as recited in claim 13, wherein establishing a compensation voltage includes attenuating an output of the first operational amplifier.

16. The method as recited in claim 15, wherein coupling a voltage compensation circuit includes providing a second operational amplifier having a first input coupled to the voltage source and a second input coupled to the attenuated output of the first operational amplifier for input of the compensation voltage thereto, an output of the second operational amplifier being coupled to the second portion of the test sample to provide the input voltage that is varied to maintain a voltage across the gap that is independent of changes in the bias current supplied from the current source.

17. The method as recited in claim 14, wherein establishing a compensation voltage includes connecting an attenuation circuit to an output of the first operational amplifier and coupling an output the attenuation circuit to the second input of the second operational amplifier.

18. The method as recited in claim 17, wherein connecting an attenuation circuit includes connecting a voltage divider between the output of the first operational amplifier and the second input of the second operational amplifier.

19. The method as recited in claim 11, wherein preparing a longitudinally extended test sample includes providing a pair of conductive contacts at the first and second portions of the test sample for respective connection to the current source and the input voltage.

20. A method of preparing a scanning tunneling microscope for the study of spin Hall effect in a test sample formed of any of a conductive thin film or semiconductor thin film, the scanning tunneling microscope having a voltage source and a sensing tip configured to be spaced from the test sample to define a gap therebetween, the method comprising:

providing a current source with an output configured to be coupled to a first longitudinal portion of the test sample to provide a bias current to the test sample; and providing a voltage compensation circuit coupled to the first longitudinal portion and a second longitudinally displaced portion of the test sample and to the voltage source for varying a voltage input to the second portion of the test sample to provide an input voltage to the test sample compensated to maintain a voltage across the gap that is independent of changes in the bias current.

21. The method as recited in claim 20, wherein providing a voltage compensation circuit includes connecting inputs of a first operational amplifier to the first and second portions of the test sample for determining voltage drop across the test sample and establishing a compensation voltage in response thereto.

22. The method as recited in claim 21, wherein providing a voltage compensation circuit includes providing a second operational amplifier having a first input coupled to the voltage source and a second input coupled to the first operational amplifier for input of the compensation voltage thereto, an output of the second operational amplifier being coupled to the second portion of the test sample to provide the input voltage thereto, the second operational amplifier varies the input voltage responsive to the compensation voltage to maintain a voltage across the gap that is independent of changes in the bias current supplied from the current source.

23. The method as recited in claim 22, wherein providing a voltage compensation circuit includes connecting an attenuation circuit to an output of the first operational amplifier and coupling an output the attenuation circuit to the second input of the second operational amplifier.

24. The method as recited in claim 23, wherein connecting an attenuation circuit includes connecting a voltage divider between the output of the first operational amplifier and the second input of the second operational amplifier.

* * * * *